United States Patent
Tomer et al.

(10) Patent No.: US 7,029,930 B2
(45) Date of Patent: Apr. 18, 2006

(54) DEVICE AND SYSTEM FOR RECORDING THE MOTION OF A WAFER AND A METHOD THEREFROM

(75) Inventors: Yigal Tomer, Jerusalem (IL); Yakov Bienenstock, Jerusalem (IL); Gershon Dorot, Jerusalem (IL)

(73) Assignee: Innersense Ltd., Jerusalem (IL)

( * ) Notice: Subject to any disclaimer, the term of this patent is extended or adjusted under 35 U.S.C. 154(b) by 0 days.

(21) Appl. No.: 10/501,602

(22) PCT Filed: Dec. 4, 2002

(86) PCT No.: PCT/IL02/00975

§ 371 (c)(1),
(2), (4) Date: Jun. 17, 2005

(87) PCT Pub. No.: WO03/060989

PCT Pub. Date: Jul. 24, 2003

(65) Prior Publication Data

US 2005/0246124 A1   Nov. 3, 2005

(30) Foreign Application Priority Data

Jan. 17, 2002   (IL) ..................................... 147692

(51) Int. Cl.
*H01L 21/66* (2006.01)

(52) U.S. Cl. ............................ 438/14; 438/18; 438/50; 702/117

(58) Field of Classification Search ............ 438/14–18, 438/48–54; 702/108–126
See application file for complete search history.

(56) References Cited

U.S. PATENT DOCUMENTS

| 4,745,564 | A | 5/1988 | Siyami et al. |
| 5,444,637 | A | 8/1995 | Smesny et al. |
| 6,410,833 | B1 | 6/2002 | Brando |
| 2002/0017708 | A1* | 2/2002 | Takagi et al. ............... 257/678 |
| 2004/0016995 | A1* | 1/2004 | Kuo et al. .................. 257/678 |

FOREIGN PATENT DOCUMENTS

EP   1 014 437   6/2000

* cited by examiner

*Primary Examiner*—H. Jey Tsai
(74) *Attorney, Agent, or Firm*—Fogg and Associates, LLC; David N. Fogg

(57) ABSTRACT

The invention provides a device that can be used to record the motion of a wafer and fine perturbations and vibrations in its motion during its progress through and between semiconductor process and inspection machines in the course of the actual manufacturing process or during a test cycle of the processing or inspection machine. It also provides a system and a method which uses this record mechanical malfunction of the processing or inspection machine which has caused, or could cause, defects in the manufactured wafer whether directly or indirectly.

27 Claims, 3 Drawing Sheets

DEVICE AND SYSTEM FOR RECORDING THE MOTION OF A WAFER AND A METHOD THEREFROM

This application claims priority to International Patent Application No. PCT/IL02/00975 filed on Dec. 4, 2002, which claims priority to IL Patent Application No. 147692 filed on Jan. 17, 2002.

FIELD OF THE INVENTION

The present invention is related to the field of manufacturing of semiconductor devices. Specifically the invention relates to the detection, measurement, and determination of cause of mechanical stress applied to semiconductor wafers and related devices during their handling by process and inspection machines.

BACKGROUND OF THE INVENTION

Equipment used in the microelectronics industry, commonly consists of one or more processing chambers. During the manufacturing process, the silicon wafer is moved through various processing steps and chambers, by use of wafer handling devices such as robots, elevators, indexers, etc. Mechanical stress—scratches, shock or vibration—applied to the wafers during their handling by semiconductor processing machines may generate scratches on one of the surfaces of the wafer, lead to the creation of particles in the processing chamber that interfere with the production process, cause other defects on the surface of the wafer, or may even result in breakage of the wafer.

The scratches or shocks can be caused by bad adjustment of the handling devices or by mechanical parts coming in contact with the wafer or other mechanical parts inside the processing machine during the transfer of the wafer from one position to another within the processing machine. Shocks can also occur when the robot arm picks up the wafer or releases it to or from a docking station. Excessive vibrations during wafer transfer can occur as a result of many types of mechanical problem such as a defective motor or ball-bearing. Shocks and excessive vibrations can also occur when a cassette containing wafers is transferred from one processing machine to another.

Scratches on the front side of the wafer may destroy dies, directly or by impact of particles released from the surface of the wafer. Scratches on the back of the wafer may cause breakage of the wafer or contribute to other malfunctions. For instance, as a result of scratches on the back of the wafer, the wafer may be positioned out of focus during the lithography steps of the manufacturing. The damage may appear long after the defective stage; and, in such a case, it may take extensive efforts to identify the defective machine. Excessive shocks and vibrations may cause similar problems and their causes may be even more difficult to isolate.

The detection and/or measurement of mechanical stress or impact and the determination of its cause are currently difficult and costly. In many cases, the disassembly of the processing machine is required to detect mechanical problems or determine the cause of mechanical problems. This results in conditions that may be very different from those existing during actual operation of the machine. These differences arise for many reasons including, for example, the fact that most machines process wafers under vacuum conditions.

U.S. Pat. Nos. 5,444,637 and 6,140,833 describe devices for monitoring parameters that are important in the manufacturing process such as: temperature, current, voltage, radiation, distance of the wafer surface from masks and other parts of the apparatus, concentration of various gases, etc. These patents describe wafers which have one or more sensors, electronic circuits, and memory devices formed on their surfaces by standard techniques. These wafers are placed in the processing machine and record the relevant data during the operation of the machine. After the process is completed, the data is read from the memory and used to confirm correct operation or suggest adjustments of the measured parameter.

Neither of these or other existing devices or methods, however, is able to provide convenient means for pinpointing the mechanical malfunctions of the processing machine that are the cause of defects in the manufactured wafer.

It is therefore a purpose of this invention to provide a device that can be used to record the motion of a wafer and fine perturbations and vibrations in its motion during its progress through and between semiconductor process and inspection machines in the course of the actual manufacturing process or during a test cycle of the processing or inspection machine.

It is another purpose of this invention to provide a system and a method which uses a record of the motion of a wafer and fine perturbations and vibrations in its motion during its progress through and between semiconductor process machines in the course of the actual manufacturing process or during a test cycle of the processing or inspection machine to detect, locate, and identify any mechanical malfunction of the processing or inspection machine which has caused, or could cause, defects in the manufactured wafer whether directly or indirectly, as for instance, by releasing particles in the processing chamber.

Further purposes and advantages of this invention will appear as the description proceeds.

SUMMARY OF THE INVENTION

In a first aspect the present invention provides a device for recording the motion of a wafer, including fine perturbations and vibrations in the motion of the wafer, during its progress through and between semiconductor process and inspection machines in the course of the actual manufacturing process or in test cycles of the machines. The device of the invention comprises a test wafer to which a miniature electronic recording system is attached. The electronic recording system being provided with memory means for storing information relative to the physical history of the wafer, and means for connecting to downloading connections through which the stored data can be transmitted to an external device.

The test wafers can have surface areas and shape, thicknesses, and weights essentially equal those of standard size production wafers or surface areas and shape essentially equal those of standard size production wafers but thicknesses and/or weights which differ from those of standard size production wafers. The test wafers are made from materials including silicon, aluminum, glass, gallium arsenide, ceramic material, or plastic.

The miniature electronic recording system is attached to the test wafer by gluing, screwing, or bolting. In a preferred embodiment, the components of the miniature electronic recording system are mounted on one or more circuit boards.

The miniature electronic recording system can be covered by an epoxy block molded on the surface of the wafer or by a thin hermetic external cover such the maximum thickness of electronics and cover is not more than 2 mm. The hermetic thin casing is made of, for example, aluminum, stainless steel, composite materials, polyurethane, silicon, ceramic materials or plastic.

The components of the miniature electronic recording system are selected from accelerometers, analog-to-digital converters, microprocessors, batteries, memory units, temperature sensors, and additional standard electronic components. The accelerometers are of many types including: dual-axis accelerometers, 3-axis accelerometers, and piezoelectric type accelerometers. The analog-to-digital converter includes an analog multiplexer which enables the digitizing of a multitude of analog signals. The microprocessor includes a real-time clock and internal program memory. The battery can be a lithium polymer rechargeable battery or a non-rechargeable battery. The memory unit is composed of RAM memory and/or Flash memory.

Additional sensors can be attached to the test wafer. These sensors are suitable for measuring temperature, light, pressure, air-flow, gas flow, humidity, clearance, electric fields and magnetic fields. A miniature camera can also be attached to the test wafer.

The miniature electronic recording system can conserve power by detecting the motion of the test wafer to which it is attached and using the presence or absence of such motion to switch off or wake up the electronics.

In a second aspect, the present invention provides a system, which records the motion of a wafer, including fine perturbations and vibrations in the motion of the wafer, during its progress through and between semiconductor process and inspection machines in the course of the actual manufacturing process or in test cycles of the machines. The system comprises a test wafer, a reader station, and a computer.

The reader station is essentially comprised of an AC power supply, interface circuits between the test wafer and the computer and, if necessary a battery charger.

The interface circuits of the reader station are electronic interface circuits. The interface circuits of the reader station can be non-contact optical or radio frequency interface circuits.

In a third aspect the present invention provides a method for using a record of the motion of a wafer, including fine perturbations and vibrations in the motion of the wafer, during its progress through and between semiconductor process and inspection machines in the course of the actual manufacturing process or in test cycles of the machines to detect, locate, and identify any mechanical malfunction of the machines which has caused, or could cause, defects in the manufactured wafer. The method comprises the following steps:

placing the test wafer on the reader station;
initializing the test wafer;
transferring the test wafer to the processing and/or inspection machines;
recording data relative to the physical history of the wafer in the internal Flash or other type of memory of the electronics circuit on the test wafer;
returning the test wafer to the reader station;
downloading the recorded data into the computer;
erasing, if desired, the internal Flash memory of the test wafer;
processing the signals from the accelerometer on the test wafer; and
comparing the recorded data to known data and interpreting the results.

Initializing the test wafer includes some or all of the steps of recharging the battery, downloading different versions of recording programs and/or other parameters from the computer into the RAM memory of the test wafer and initializing the real-time clock.

The signals are processed using the strategies of either on-wafer signal processing followed by low sampling-rate signal digitizing or high-rate signal sampling followed by computer-based signal processing.

The known data to which the recorded data is compared is selected from either the precise known time-schedule of events inside the processing machine and/or "known-good" readings or "fingerprints" of signals previously recorded on the same or on similar processing machine. Additionally special software for signal recognition can be used to automatically detect and interpret "known" problems. For example, if an abnormal signal due to a faulty robot arm bearing presents a specific signal pattern, it is kept in the computer memory to be automatically recognized in the future.

All the above and other characteristics and advantages of the invention will be further understood through the following illustrative and non-limitative description of preferred embodiments thereof, with reference to the appended drawings.

DETAILED DESCRIPTION OF PREFERRED EMBODIMENTS

Although the following description of the invention describes the handling of semiconductor wafers, it is to be understood that this is in order to provide an example of the invention which can be extended mutatis mutandis to related fields such as the manufacturing of Flat-Panel displays and LCD displays.

Figure 1B:
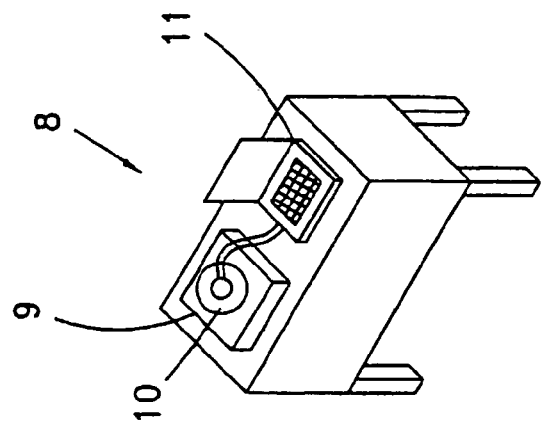
FIG. 1 schematically shows a general diagram of a system according to a preferred embodiment of the invention.
Figure 1A:
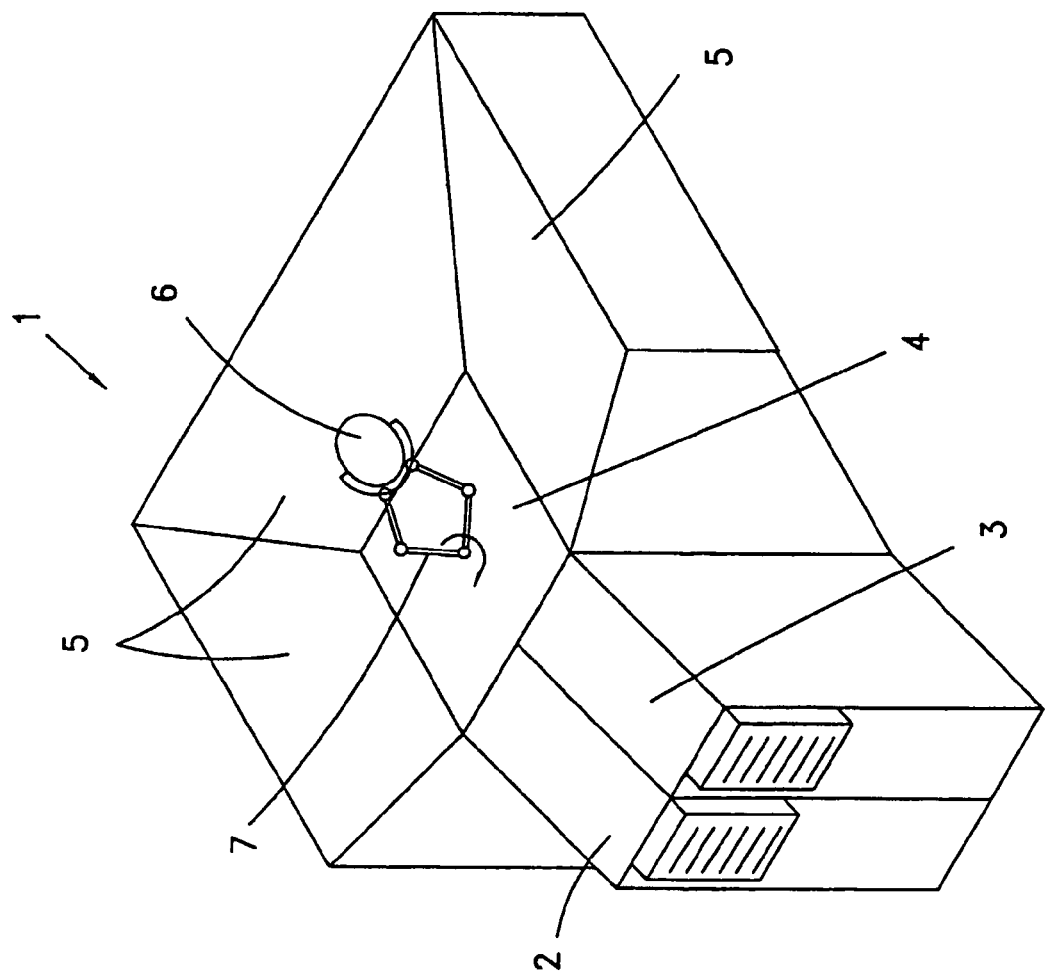

FIG. 1 schematically shows a general diagram of the system of the invention. A typical processing machine 1, as is commonly used in modern semiconductor plants, is shown in FIG. 1A. Processing machine 1 is comprised of a unit for inputting the blank wafers 2, a unit for storing the wafers after processing 3, a number of chambers 5 in which the various processes are carried out, and a transfer chamber 4. The wafer 6 is moved between the chambers by handling device 7.

FIG. 1B schematically shows the diagnostic station 8 of the system. It consists of at least one test wafer 10, a reader station 9, and a personal computer, or preferably a PC Notebook 11. The test wafers 10 are placed in the reader station 9 where they are initialized, then they are loaded into the processing machine 1 where they will record and store in a memory unit various measurements relative to the physical history of the wafer as will be explained hereinbelow. After recording the measurements, they are returned to the reader station for the downloading of the recorded data and its interpretation.

In order to measure mechanical impact, the system of the invention makes use of a test wafer to which a complete miniature electronic recording system is attached. Standard production wafers in modern semiconductor processing plants are currently 200 mm in diameter and the industry is moving towards use of 300 mm wafers. In addition, 6" (150 mm) wafers are still popular in older processing plants. For each production wafer size, a test wafer of corresponding size is produced.

In the preferred embodiment of the invention, the test wafers generally consist of a standard virgin silicon or aluminum wafer on the surface of which a very thin electronic assembly is attached, e.g. by gluing or any other suitable means such as use of miniature screws or bolts. The electronic assembly is composed of two thin (approximately 0.5 mm) printed circuit boards (PCBs) with a thin rechargeable battery and of various electronic components soldered on one side only of the PCBs. All electronic components are low-profile (under 2 mm) surface mounted technology (SMT) components. The electronic assembly is then encased in a hermetic thin casing. In other embodiments, the electronics are positioned on one or more PCBs and/or the test wafers are made of aluminium or other material tolerable in the clean-room manufacturing environment such as gallium arsenide, ceramics, glass, or suitable plastics.

The surface geometry of the test wafers is essentially identical to the surface geometry of standard production wafers. The attached electronics causes the weight and thickness of the test wafer to deviate relatively insignificantly from the weight and thickness of a standard production wafer. By way of example, a standard production 8" silicon wafer may weigh 50 grams and a 6" wafer about 30 grams. The PCBs of the preferred embodiment of the invention with all electronic components weigh about 15 grams including battery. The test wafer may therefore be handled by the normal handling equipment of the semiconductor processing machines in exactly the same way as standard production wafers. Current handling equipment should normally have no difficulty and should not show significant differences in handling even a 50% overweight. In the future the 15 grams weight of the electronics will be reduced and the weight of the wafer will rise since the industry is adopting 300 mm (12") wafers as standard.

If necessary, the test wafers can be made exactly identical to standard wafers, in thickness and weight, by first grinding the surface of a standard silicon wafer to reduce its thickness from about 0.7 mm to about 0.3 mm and then embedding the electronic circuits inside the freed volume. This can be done on part of the surface, for instance, within a circle centered on the center of the wafer. The electronic components are then embedded inside the freed volume and covered by epoxy glue or other suitable means to restore the upper surface to its original level. Wafers produced from other materials can likewise be first made thinner and lighter than the standard ones in order to get functional test wafers with properties identical to those of the standard wafers.

While it is normally desirable to match the physical characteristics of the test wafer to that of production wafers, in some cases it may be of interest to deliberately modify the mechanical properties of the test wafers in order to test the handling systems under more extreme conditions. For example, test wafers can be made intentionally heavier or lighter and/or small artificial protrusions or passive wings may be mounted on either face of the test wafer. These wings should be flexible enough so as not to prevent the displacement of the wafer, yet rigid enough so as to cause a perturbation in the normal movement of the wafer, which will be detected by the accelerometer, whenever the wings come in contact with external parts. Thus, additional clearance can effectively be verified along the path of the wafer through the processing machine. In some situations, it is advantageous to use electrically sensitive or active wings in place of passive wings and to connect their outputs to the electronic circuits of the test wafer.

In a preferred embodiment of the invention, an epoxy block is molded on the wafer and, attached to the wafer, all around the miniature electronic recording system. If it is desired to have access to the electronic circuits and battery for servicing, a thin hermetic external cover is mounted above the miniature electronic recording system and attached to the wafer, all around the electronic assembly by suitable means such as soldering or gluing. The external cover is of a thickness such that the maximum height of the electronics and cover is preferably no more than 2 mm and can be made from any material suitable for the manufacturing environment, for example; aluminum, stainless steel, silicon, ceramic materials, composite materials, polyurethane, plastic, etc. This external cover serves to hermetically and thermally isolate the electronic circuits from the process chamber. Since some metals and materials are strictly banned from use in clean-rooms and specific process machines, only metals and materials accepted for use in the art appear on the outside of the casing.

The external cover or epoxy mold has several functions and allows the use of the test wafer under virtually all production conditions:

1) It allows use of the test wafer in a vacuum, even when some of the electronic components, such as the battery, may leak under vacuum conditions. An epoxy mold is the best choice for isolating the electronics under vacuum conditions.
2) The encasing of the electronic assembly protects the process chamber from pollutants or particles which may originate from the various parts of the electronic assembly, even under non-vacuum conditions. The encasing of the battery is especially important since some batteries, if not hermetically encased, may leak noxious or otherwise damaging gasses into the process chamber.
3) The external cover provides a certain level of protection to the electronic assembly from corrosive gases, plasmas or other hostile conditions which are found in some process chambers.
4) The external cover may additionally be designed so as to thermally isolate the electronic assembly from the surrounding heat. Thus, the test wafers can be used in hot process chambers, provided that their stay in these chambers is not of too long a duration.

When an external cover is mounted over the wafer and the electronic assembly, it is usually advantageous to create a vacuum inside the cover. Thus, under normal atmospheric ambient conditions the upper surface of the casing is pressed downwards against the internal electronic components providing sufficient mechanical strength to the test wafer even when, as is generally the case, the external cover is very thin. When the test wafer is used in a vacuum environmental, no net force will be applied on the upper surface since the external and internal pressures will be similar; if however the volume under the external cover is not evacuated, then the internal pressure could result in rupture of the cover. In addition, vacuum conditions inside the cover provide improved thermal isolation of the electronics.

Alternatively, if the internal electronic components do not leak under vacuum conditions, venting holes can be made at various locations in the cover of the casing so that the air inside the casing can be evacuated or restored when the test wafer enters or is removed from a vacuum environment.

Figure 2:
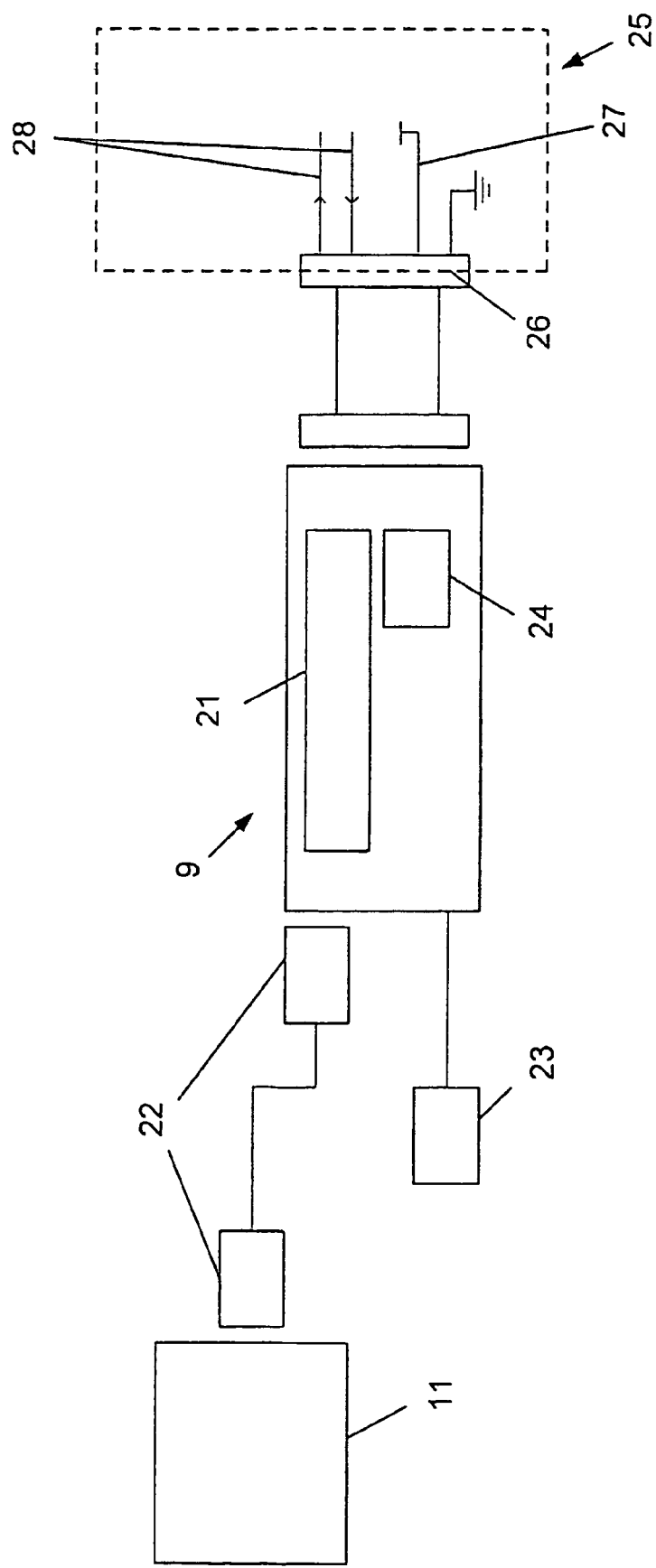
FIG. 2 is a block diagram of the system of FIG. 1, according to a preferred embodiment of the invention.

FIG. 2 is a block diagram of the system of FIG. 1. The PC Notebook 11 is schematically represented on the left and on the right one of the PCBs 25 of the test wafer. The reader station 9 electronics essentially consist of an AC power supply 23, electronic interface circuits 21 for the RS232 serial communication 22 between the PC Notebook 11 and the test wafer, and battery-charger electronics 24 for the recharging of the internal battery on the test wafer. The test wafer electronics is equipped with a special external connector 26 which provides fast connections to the battery 27 and to the serial communication contacts 28.

In the presently preferred embodiment of the invention, the reader station has a receptacle for a single test wafer. The test wafer is seized with a vacuum wand (or with another type of hand accessory as used in the industry) and delicately placed at the correct position and with the correct angular orientation in the receptacle of the reader station. When correctly placed, the wafer is positioned with an x-y-z accuracy of about 0.2 mm (the room left between the wafer and the internal side of the receptacle). The wafers usually have a "notch" (for 8" and 12" wafers) or "flat" (for 6" wafers) on their outer periphery to precisely mark an angular reference on the wafer. During the mounting operation of the electronic assembly with its central connector on the test wafer, the x-y position and the angular position of the electronic assembly and central connector relative to the "notch" or "flat" of the wafer is precisely determined so that all the test wafers have their electronic elements similarly positioned and oriented. The receptacle of the reader station is designed such that the operator also has to place the wafer with a precise angular position relative to this notch or flat. In this way, the orientation of the central connector on the wafer relative to the reader station is also precisely determined. Now, the operator lowers the connector head of the reader station in which several spring-loaded contact probes are mounted. The spring-loaded contact probes precisely make contact with the corresponding contacts on the electronics of the test wafer. In other embodiments, the reader station is designed for several wafers and/or for contactless communication with the Notebook PC and/or incorporates a standard "notch-finder" or "flat-finder" to automatically rotate the wafer to the correct angular position.

Figure 3:
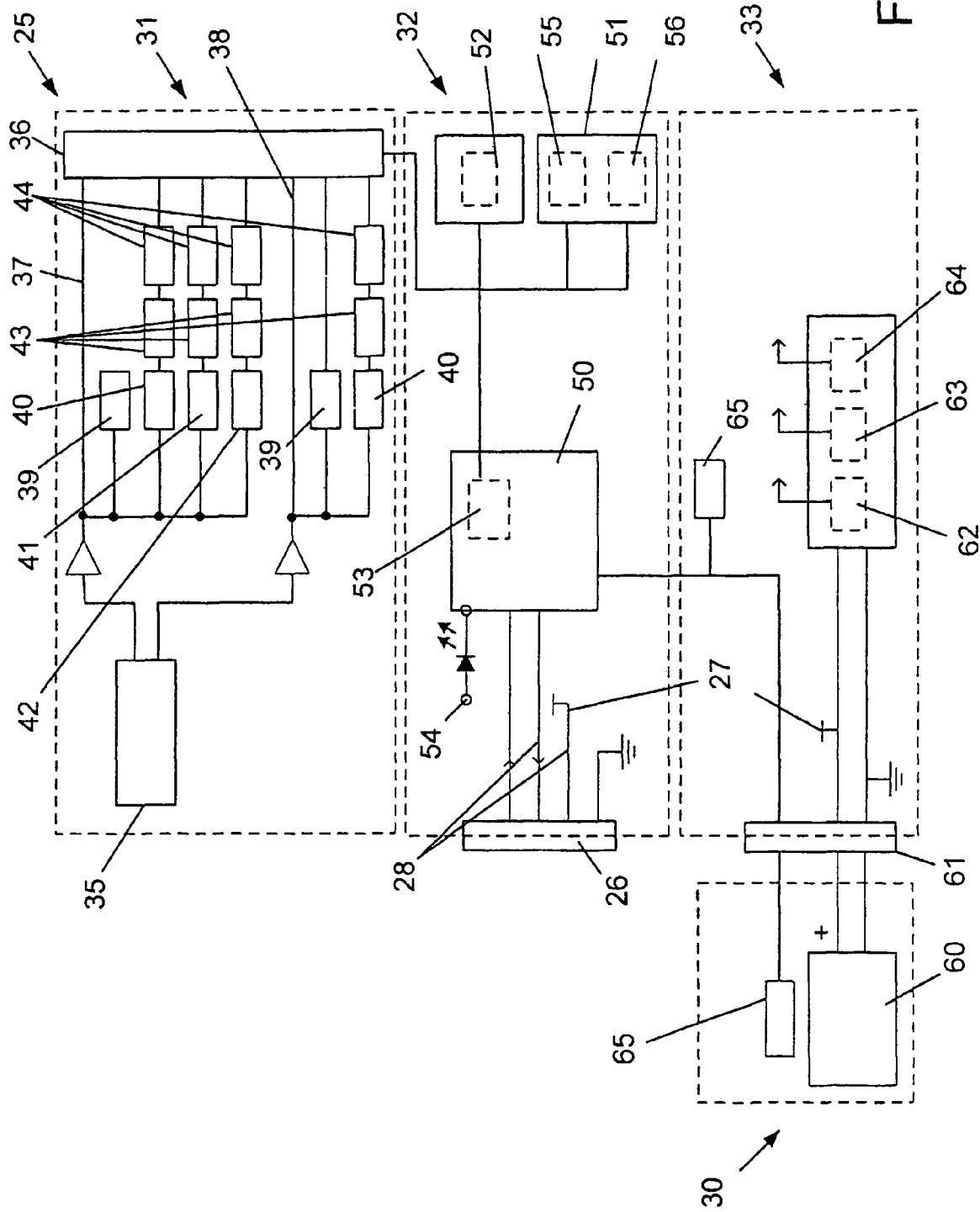
FIG. 3 is a block-diagram of the electronic circuits of the test wafer, according to another preferred embodiment of the invention.

FIG. 3 is a block-diagram of the electronic circuits of the test wafer. The diagram is generally divided into three parts: the top showing the analog part of the electronics 31, the middle the digital part 32, and the bottom the power management part of the electronics 30 and 33. In a preferred embodiment of the invention, 31, 32, and 33 together comprise the PCB 25 of FIGS. 2 and 30 is a second PCB.

The analog part of the electronics consists of an accelerometer 35, analog processing circuits, and of an analog to digital converter (ADC) 36. The accelerometer 35 is a dual-axis accelerometer which is capable of measuring acceleration simultaneously along two orthogonal axes. The acceleration measured includes constant acceleration forces, such as the earth's gravitational field or prolonged acceleration movements, mechanical shock, perturbations, and vibration. Each output of the accelerometer is an analog voltage which, when a constant offset voltage is subtracted from it, is proportional to the acceleration along the respective sensing axis. A suitable commercially available sensor for use in the electronics of the invention is, for example, P/N ADXL202E made by Analog Devices Inc.

In other embodiments, other types of accelerometers are used including those capable of providing 3-axis measurements, higher sensitivity or signal-to-noise ratio, better response at specific frequencies, or smaller packaging. One type of accelerometer that is advantageously employed in certain situations is a piezoelectric type such as the Model 22 made by Endevco Corporation.

In a preferred embodiment, the ADC 36 includes an analog multiplexer which enables the digitizing of eight different analog signals. These are, for example, raw signals 37, 38 representing the measured acceleration of the wafer along the X and Y axis of the accelerometer respectively, and six other spectral components of these two basic signals, processed by analog filters 39–42, peak-detectors 43, and sample-and-hold electronic circuits 44. The analog filters in this embodiment are: 10 Hz low-pass filters 39, 10–100 Hz band-pass filters 40, 10–1000 Hz band-pass filter 41, and 1 kHz high-pass filter 42. A suitable commercially available ADC for use in the electronics of the invention is, for example, P/N MAX1290AEEI made by Maxim Integrated Products.

The digital components of the electronics, shown at 32 of FIG. 3 are comprised mainly of a microprocessor 50, RAM memory 51 and Flash memory 52. A suitable commercially available microprocessor for use in the electronics of the invention is, for example, P/N DS87C530ENL made by Dallas Semiconductor. The DS87C530ENL microprocessor includes, in addition to standard microprocessor functions, a real-time clock (RTC) 53 and 16 kbytes of internal program memory programmed with hardware initialization, test routines, and a loader program. Although in the presently described embodiment of the invention, a Flash memory is preferred, other types of memory such as RAM are used as the internal memory to record the signals from the accelerometer in other embodiments.

Suitable commercially available RAM memory and Flash memory units for use in the electronics of the invention are respectively, for example, P/N K6T1008V2E and P/N KM29U128IT made by Samsung Electronics. RAM memory unit 51 consists of data memory 55 and program memory 56 subunits. P/N KM29U128IT is a 16 Mbyte Flash memory chip. 64 Mbyte Flash memory units are now commercially available from Samsung and can be advantageously used for more recording capacity.

Also shown at section 32 of PCB 25 are external connector 26, which provides fast connections to the battery contacts 27 and to the serial communication contacts 28, and a LED 54, which gives a visible indication that the electronics have been activated.

In the bottom part of FIG. 3, is schematically shown the power management part of the electronics. It consists mainly of a rechargeable battery 60 mounted on a separate PCB 30 and of three DC/DC converter integrated circuits 62–64 mounted at 33 on PCB board 25.

Suitable commercially available devices for use in the electronics of the invention are, for example, SLPB-103462 1 mm-thick Lithium Polymer battery made by Kokam Engineering Co. (South Korea) and DC/DC converter integrated circuits LTC1751 and LTC 1516 made by Linear Technology. In a preferred embodiment, the three DC outputs are +3.3V and +5V analog and +5V digital signals. In some embodiments, non-rechargeable batteries are used. Suitable batteries of this type are, for example, energy cells made by Power Paper Ltd. (Israel), Ultralife Li/MnO2 Battery P/N U3VF-K-T made by Ultralife batteries Inc. (USA), and Eagle Picher Thionyl Chloride Battery P/N LTC-312 made by Eagle Picher Technologies LLC (USA).

In addition, two temperature sensors 65 (for example, P/N DS1721 made by Dallas Semiconductor) are placed one on each of the PCB boards.

The test wafer's electronics consist of very low-power components and has a special architecture which permits further significant reduction of the power consumption. All of the circuits of the analog part of the electronics, shown at 31 in FIG. 3, are switched-off whenever not in use. Additionally microprocessor 50 enters a special stop mode whenever no recording is required, keeping only track of time and retaining memory of all the data and other parameters required in order to wake-up in time to resume recording. Since the wake-up time of the microprocessor is extremely fast and the wake-up time for the switched-off electronic circuits is also fast, the microprocessor can usually be stopped between samplings and the circuits at 31 can also be powered-down, depending on the desired sampling rate. The recording may also be stopped according to time-zones programmed into the test wafer at the time of initialization or whenever no motion is detected for a given time period by the on-board accelerometer, in which case it is automatically resumed when motion is again detected. As a result of the above, the rechargeable battery provides power for 1 to 10 hours of actual recording within a time period of one or even several days.

The method of the invention comprises several broad steps. At the beginning of the recording/diagnostic cycle, the test wafer is placed on the reader station. There, the battery is recharged, and the real-time clock (RTC) is initialized by the Notebook PC. The RTC keeps track of actual time and permits the recording of timestamps along the data recorded by the test wafer. The microprocessor on the test wafer contains an internal program memory, which is programmed with hardware initialization and test routines and a loader program.

By means of the loader program, different versions of recording programs and/or other parameters, e.g. the sampling rate, can be downloaded at the reader station from the Notebook PC into the RAM memory of the test wafer for subsequent execution.

In the second step, the test wafer is transferred into the process machine, using the same handling equipment normally used for standard production wafers. The test wafer electronics then records all the movements, vibrations, accelerations and other selected physical parameters imposed upon the wafer during the entire time period that the wafer is within the process machine.

It is to be noted that, once the electronics on the test wafer has been initialized, it is capable of measuring all motion of the wafer as it is moved anywhere, both inside and outside of the various processing and inspection machines, and as it is moved from station to station or even between rooms in the production plant. In addition, the electronics on the test wafer records, and can be used to identify, vibrations and shocks that are caused by other elements in the processing environment that are not directly connected to the test wafer such as valves, motors and pumps.

When the wafer is recording the signals from its accelerometer in an atmospheric environment, it functions much as a large ear and detects and records—in addition to the movements of the wafer itself—any noise which is "heard" nearby. In a vacuum its "hearing" capabilities are limited to—in addition to the movements of the wafer itself—perturbations and vibrations transmitted by the mechanic elements holding the wafer. The "hearing" capabilities of the test wafer are nonetheless appreciable even in this case and can reach to remote elements which will be of interest to the user. The data described above is also strictly time-related to the sequence of events recorded by the test wafer and therefore analysis of the performance of remote elements, which might be otherwise difficult to analysis under real conditions, can be accomplished using the device and method of the invention.

The data is recorded in the internal Flash memory of the electronics circuit on the test wafer, which has enough capacity for many hours of continuous recording under a moderately-low sampling rate.

In the third step, the test wafer is returned to the reader station. The recorded data is then downloaded into the Notebook PC. Subsequently, the internal Flash memory of the test wafer can be erased if desired and the test wafer is ready for a new sequence of recording. If the remaining charge of the internal battery is insufficient, then the battery must be recharged before reusing the test wafer.

In some embodiments of the invention, communication not involving physical contact between the Test Wafer and the MEA reader is advantageously used. For instance optical transponders with infrared or visible light LEDs and detectors are mounted on the test wafers with matched LEDs and detectors on the reader. In this way, fast download can be performed for a full batch of test wafers concurrently, and, contact with, and possible damage to, the wafers is avoided. In this case, a non-contact recharging technique is also used for the battery. Alternatively, non-rechargeable batteries are used or the rechargeable batteries are recharged only at other occasions. In other embodiments radio frequency (RF) techniques are used to transfer information between the test wafer and the reader.

Finally, the signals recorded by the test wafer are interpreted by the Notebook PC or by another computer to which the data is transferred.

As described hereinabove, a miniature accelerometer is incorporated in the electronic circuits of the test wafer. It is the output signals of the accelerometer, which are accurately recorded and stored in the test wafer's internal memory that must be analyzed at this stage. The miniature accelerometer used in the test wafer is very sensitive (order of resolution 1 milli-g over a full-scale range of ±2 g) and has a frequency response ranging from DC to over 6 kHz. In order to fully exploit the signal from the sensor, one of two basic signal-processing strategies can be chosen.

The first strategy involves on-wafer signal processing followed by low sampling-rate signal digitizing. This strategy is illustrated in the implementation of the test wafer electronics described with reference to FIG. 3. The X-raw and Y-raw signals are filtered by low-pass, high-pass, and band-pass filters followed by peak detectors and sample-and-hold circuits. The output of the low-pass filters is sampled at a relatively low rate (e.g. 64 Hz) and conveys a time-related description of the broad movements of the wafer (translation, rotation, elevation etc.). The output of the high-pass and band-pass filters is processed by peak-detector and sample-and-hold circuits, and then sampled at a similarly low rate. They convey shock and vibration information which is time related to the low-pass data and can be interpreted to reveal the severity of the shocks and vibrations and to identify the origin of the mechanical perturbations. At the end of the recording session the test wafer is returned to the reader station and the recorded data is downloaded into the PC Notebook.

The second strategy consists of high-rate signal sampling followed by PC-based signal processing. Using this strategy, the two outputs of the sensor X-raw and Y-raw, i.e. the unfiltered signals of the sensed acceleration along the X-axis and the Y-axis of the accelerometer respectively, are digitized at a high sampling-rate of several kHz (note that according to the Nyquist criterion, at a typical sampling rate of 12 kHz, up to 6 kHz of signal bandwidth can be recovered. The electronic circuits of the test wafer permit a sampling rate of over 50 kHz and thus permit the recording of signals extending to over 25 kHz). The analog filters, peak detectors and sample-and-hold circuits shown in FIG. 3 are not used in this case.

At the end of the recording session, the test wafer is returned to the reader station and the recorded data is downloaded into the PC Notebook. The data is then processed by the PC or another computer using appropriate digital filtering techniques in order to separate and analyze the various spectral components of the X-raw and Y-raw signals as a function of time for the duration of the recording session. For this purpose, standard signal processing software can be used such as in the Labview Signal Processing Toolkit sold by National Instruments. This second strategy offers more versatile and precise analysis of the accelerometer's signals, but it requires more battery power and memory capacity per recording hour than the first strategy.

In both cases, the recorded data is available for display on the Notebook's screen right after having been downloaded from the test wafer. Separate graphs may be displayed, some representing the broad movements of the wafer and others the occurrences of shocks or vibrations. All graphs have a common time scale. The data can therefore be related to the precise known time-schedule of events inside the processing machine, which can usually be downloaded in the form of a data file from modern semiconductor processing machines. Additionally, the user may have at his disposal a number of "known-good" readings or "fingerprints" of signals previously recorded on the same or on similar processing machine. With these, the user will have the means to identify the successive handling stages of the wafer inside the machine and to detect, measure, and diagnose any abnormal events, i.e. scratches, shocks, or vibrations, which could damage the wafer. Since the occurrence of abnormal events is detected and time-stamped, the location and cause of mechanical failures can accurately be established and tracked. With the use of additional special (learning) software for signal recognition, "known" failures are automatically detected and interpreted by the computer. For example, if an abnormal signal due to faulty robot arm bearings presents a specific signal pattern, this pattern is kept in the computer memory to be automatically recognized in the future.

The test wafers can be used in various ways. As part of ordinary preventive maintenance activities they are introduced into the process machine and serve to verify that the handling of the wafers is fault-free. The test wafers can also be used during production for troubleshooting a machine with a high rate of defects or breakage problems. Tests can be conducted either whenever a doubt arises or at given periodic time intervals. Several test wafers can be introduced into the process machine simultaneously in order to speed up the test procedure. This is particularly important since some failures may occur only intermittently or, in cases in which each wafer has a different route inside the process machine, only for one specific wafer out of a full batch.

By way of illustrating the application of the method of the invention, suppose that a person in charge of the wafer handling inside a specific machine wants to make sure that wafers do not touch any other mechanical parts inside the machine when being transferred from point A to point B. Employing the known procedure of the prior art, he would disassemble the machine. Apart from time required and cost expended, he would not be able to see the machine working in its real conditions, nor could he simulate vacuum or other environmental conditions.

Using the system of the invention, he loads one or several test wafers into the machine. After a short wait the test wafers automatically exit the machine. The data is now downloaded into the PC Notebook and the occurrence of any contact of the wafer with any part of the machine can be determined by either comparing the newly obtained graphs to "known-good" graphs previously recorded on the same machine and/or by comparing the timing of the main events to the time-schedule of events taking place within the machine.

Assuming that the transfer of the wafer from point A to point B is absolutely smooth and vibration-free in the "known-good" graphs, any disturbance in the new graphs between the time points identified as point A and point B will signal an abnormal condition which can be characterized and tracked down. Assuming that the transfer from point A to point B involves some vibration or humming in the "known-good" graphs, these normal reference signals can be subtracted from the new graphs and abnormal signals highlighted.

It will be appreciated by those skilled in the art that all of these operations, including synchronization, filtering, comparing, feature extraction, and analysis can be automatically performed by the PC Notebook using ad-hoc programs and algorithms.

The skilled person will recognize that additional sensors may also be used to identify the exact position of the test wafer as a function of time not only to identify the position of the wafer but also to provide valuable information on actual physical conditions inside the processing chambers. For example, in the preferred implementation discussed hereinabove are included two temperature sensors mounted inside the external cover of the test wafer. Additional temperature sensors can be placed on the outside of the enclosure with high temperature measurement capability in order to map and record the true temperature distribution on the surface of the wafer at various locations and under various process conditions. Likewise, appropriate miniature sensors mounted on the test wafer can be added in order to test, map and record other physical parameters inside the process chamber such as light, pressure, air-flow, gas-flow, humidity, clearance (using, for example, ultrasound), electric and magnetic fields. For instance, light sensors with selective sensitivity in the UV portion of the light spectrum can be used to check actual plasma light glow conditions inside the process chamber. In addition a miniature camera can be mounted on the test wafer and the images it gathers recorded in the Flash memory with the rest of the data. Using the method described above the exact location of the test wafer at the time the data from any of these sensors is recorded is precisely determined providing additional valuable information for analyzing the production process. This data can also be used to measure the air flow along the wafer route between machines to determine if and where any deviations from laminar flow occur. This information is vital for keeping the airborne particle level low in the so-called "mini-environment" processing environment.

Although embodiments of the invention have been described by way of illustration, it will be understood that the invention may be carried out with many variations, modifications, and adaptations, without departing from its spirit or exceeding the scope of the claims, in particular the invention can be extended mutatis mutandis to related fields such as the manufacturing of Flat-Panel displays and LCD displays.

The invention claimed is:

1. A system for detecting, identifying, and locating any mechanical malfunction, which has caused, or could cause, defects in a wafer manufactured by semiconductor process and inspection machines in the course of the actual manufacturing process or in test cycles of said machines, said system comprising:
   a test wafer, comprising a miniature electronic recording system, which comprises at least one accelerometer and circuitry for recording data that characterizes the motion of said test wafer, including fine perturbations and vibrations in its motion during its progress through and between said semiconductor process and inspection machines;
   a computer, comprising: software for initializing and downloading recorder programs to said miniature electronic recording system before said test wafer is placed in said semiconductor process and inspection machines; software for transferring said data that characterizes the motion of said test wafer from said miniature electronic recording system to said computer; known data, which describes the "known good" behavior of a wafer during its progress through and between said semiconductor process and inspection machines; and software for detecting, identifying, and locating said mechanical malfunction; and
   a reader station, comprising an AC power supply, interface circuits between said test wafer and said computer, and, if necessary, a battery charger;
   wherein;
   said recorder programs cause said data that characterizes the motion of said test wafer to be recorded along the entire path of said test wafer through and between said semiconductor process and inspection machines; and
   said software for detecting, identifying, and locating said mechanical malfunction detects, identifies, and locates said mechanical malfunction by comparing said recorded data that characterizes the motion of said test wafer with said known data.

2. The system according to claim 1, wherein the test wafer is selected from the group comprising:
   wafers whose surface area and, shape, thickness, and weight are essentially equal to those of standard size production wafers; and
   wafers whose surface area and shape are essentially equal to those of standard size production wafers but whose thickness and/or weight differ from those of standard size production wafers.

3. The system according to claim 2, wherein the test wafer is made from a material selected from the group comprising:
   silicon;
   aluminum;
   glass;
   gallium arsenide;
   ceramic material; and
   plastic.

4. The system according to claim 1, wherein the miniature electronic recording system is attached to the test wafer by means selected from the group comprised of:
   gluing;
   screwing; and
   bolting.

5. The system according to claim 1, wherein the components of the miniature electronic recording system are mounted on one or more circuit boards.

6. The system according to claim 1, wherein the miniature electronic recording system is covered by an epoxy block molded on the wafer.

7. The system according to claim 1, wherein a thin hermetic external cover is mounted over the miniature electronic recording system and is attached to the wafer.

8. The system according to claim 7, wherein the hermetic thin casing has a thickness such that the maximum height of the electronics and cover is preferably no more than 2 mm.

9. The system according to claim 7, wherein the hermetic thin casing is made of a material chosen from the group comprised of:
   aluminum;
   stainless steel;
   composite materials;
   polyurethane;
   silicon;
   ceramic materials; and
   plastic.

10. The system according to claim 1, wherein the miniature electronic recording system additionally comprises components selected from the group comprised of:
    analog-to-digital converters;
    microprocessors;
    batteries;
    memory units;
    temperature sensors;
    analog multiplexers;
    analog filters;
    peak-detectors; and
    sample-and-hold electronic circuits.

11. The system according to claim 1, wherein the accelerometers are selected from the group comprised of:
    dual-axis accelerometers;
    3-axis accelerometers; and
    piezoelectric accelerometers.

12. The system according to claim 10, wherein the analog-to-digital converter includes an analog multiplexer, which enables the digitizing of a multitude of analog signals.

13. The system according to claim 10, wherein the microprocessor includes a real-time clock and internal program memory.

14. The system according to claim 10, wherein the battery is a rechargeable battery.

15. The system according to claim 14, wherein the rechargeable battery is a lithium polymer battery.

16. The system according to claim 10, wherein the memory unit is composed of RAM memory and/or Flash memory.

17. The system according to claim 1, wherein additional sensors are attached to the test wafer, said sensors being suitable to measure parameters selected from the group comprised of:
    temperature;
    light;
    pressure;
    air-flow;
    gas flow;
    humidity;
    clearance;
    electric field; and
    magnetic field.

18. The system according to claim 1, wherein a miniature camera is attached to the test wafer.

19. The system according to claim 1, wherein the miniature electronic recording system detects the motion of the test wafer to which it is attached and uses the presence or absence of said motion to switch off or wake up said electronics in order to conserve power.

20. The system according to claim 1, wherein the interface circuits of the reader station are electronic interface circuits.

21. The system according to claim 1, wherein the interface circuits of the reader station are non-contact interface circuits.

22. The system according to claim 21, wherein the non-contact interface circuits of the reader station are optical interface circuits or radio frequency interface circuits.

23. A method for using a record of the motion of a test wafer, including fine perturbations and vibrations in the motion of said wafer, during its progress through and between semiconductor process and inspection machines in the course of the actual manufacturing process or in test cycles of said machines, to detect, identify, and locate any mechanical malfunction of the processing machine which has caused, or could cause, defects in the manufactured wafer, comprising the following steps:
   placing said test wafer on the reader station;
   initializing said test wafer;
   transferring said test wafer to said processing machine;
   operating said processing machine under normal operating conditions;
   recording, in the miniature electronic recording system mounted on said test wafer, data from at least one accelerometer, said data characterizing the motion of said test wafer;
   processing the signals from the accelerometer on said test wafer;
   returning said test wafer to said reader station;
   ownloading said recorded data into a computer;
   erasing, if desired, said data recorded in said of said miniature electronic recording system; and
   detecting, identifying, and locating any mechanical malfunction of the processing machine;
   wherein;
      said data that characterizes the motion of said test wafer is recorded along the entire path of said test wafer through and between said semiconductor process and inspection machines; and
      the software of said computer detects, identifies, and locates said mechanical malfunction by comparing said recorded data characterizing the motion of said test wafer with known data previously stored in the memory of said computer.

24. The method according to claim 23, wherein initializing the test wafer includes some or all of the following steps:
   recharging a battery on said test wafer;
   downloading different versions of recording programs and/or other parameters from the computer into the memory of said test wafer; and
   initializing the real-time clock on said test wafer.

25. The method according to claim 23, wherein the signals are processed using one of the strategies selected from the group comprising:
   on-wafer signal processing followed by low sampling-rate signal digitizing; and
   high-rate signal sampling followed by computer-based signal processing.

26. The method according to claim 23, wherein the known data to which the recorded data is compared is selected from the group comprising:
   the precise known time-schedule of events inside the processing machine; and
   "known-good" readings or "fingerprints" of signals previously recorded on the same or on similar processing machine.

27. The method according to claim 23, wherein comparing the recorded data to known data additionally comprises the use of special software for signal recognition to automatically detect and interpret "known" problems.

* * * * *